United States Patent
Lysov et al.

(10) Patent No.: US 11,646,820 B2
(45) Date of Patent: May 9, 2023

(54) ELECTRONIC DEVICE HAVING A CRC GENERATOR AND METHOD FOR TRANSMITTING DATA FROM AN ELECTRONIC DEVICE TO A CONTROL UNIT

(71) Applicant: OSRAM Opto Semiconductors GmbH, Regensburg (DE)

(72) Inventors: Andrey Lysov, Regensburg (DE); Tim Boescke, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 4 days.

(21) Appl. No.: 17/622,244

(22) PCT Filed: May 19, 2020

(86) PCT No.: PCT/EP2020/063933
§ 371 (c)(1),
(2) Date: Dec. 23, 2021

(87) PCT Pub. No.: WO2020/259927
PCT Pub. Date: Dec. 30, 2020

(65) Prior Publication Data
US 2022/0353013 A1  Nov. 3, 2022

(30) Foreign Application Priority Data

Jun. 27, 2019 (DE) ...................... 10 2019 117 350.7

(51) Int. Cl.
*H04L 1/00* (2006.01)
*H03M 13/09* (2006.01)

(52) U.S. Cl.
CPC .......... *H04L 1/0061* (2013.01); *H03M 13/09* (2013.01); *H04L 1/0041* (2013.01); *H04L 1/0045* (2013.01)

(58) Field of Classification Search
CPC ... H04L 1/0041; H04L 1/0061; H04L 1/0045; H04L 1/0036
See application file for complete search history.

(56) References Cited

U.S. PATENT DOCUMENTS

| 5,483,230 A | 1/1996 | Mueller |
| 2017/0075603 A1 | 3/2017 | Trantham |

(Continued)

OTHER PUBLICATIONS

Cliff De Locht et al., "Robust Optical Sensors for Safety Critical Automotive Applications", SPIE Proceedings Integrated Optoelectronic Devices 2008, Optical Components and Materials V, Jan. 19-24, 2008, pp. 68901C-1-68901C-9, vol. 6890, San Jose, California, United States.

(Continued)

*Primary Examiner* — Shelly A Chase
(74) *Attorney, Agent, or Firm* — Viering, Jentschura & Partner MBB

(57) ABSTRACT

A method and an optical sensor are described herein. The optical sensor may include a communication interface for receiving data from a control unit and for transmitting data to the control unit, a storage unit with at least one register for storing data, and a CRC generator for generating a CRC checksum. The optical sensor may be configured in such a way that when data stored in the storage unit is to be transmitted to the control unit, the communication interface receives from the control unit a device address specific to the optical sensor and an address of a register in which the data to be transmitted is stored. The CRC generator may be initialized using the device address received from the communication interface and/or the register address received from the communication interface, before the CRC generator generates a CRC checksum for the data to be transmitted.

11 Claims, 2 Drawing Sheets

(56) References Cited

U.S. PATENT DOCUMENTS

| | | | |
|---|---|---|---|
| 2017/0104733 A1 | 4/2017 | Thanigasalam | |
| 2017/0331548 A1* | 11/2017 | Kim | H04L 1/0036 |
| 2018/0322454 A1 | 11/2018 | Komoni | |
| 2018/0348049 A1* | 12/2018 | Yoon | G09G 3/3208 |
| 2019/0238232 A1* | 8/2019 | Tanaka | H04L 12/413 |

OTHER PUBLICATIONS

German Search Report issued for the corresponding Application 10 2019 117 350.7, dated Feb. 5, 2020, 11 pages (for informational purposes only).

International Search Report issued for the corresponding PCT Application No. PCT/EP2020/063933, dated Aug. 25, 2020, 17 pages (for informational purposes only).

* cited by examiner

ELECTRONIC DEVICE HAVING A CRC GENERATOR AND METHOD FOR TRANSMITTING DATA FROM AN ELECTRONIC DEVICE TO A CONTROL UNIT

CROSS-REFERENCE TO RELATED APPLICATIONS

The present application is a national stage entry according to 35 U.S.C. § 371 of PCT application No. PCT/EP2020/063933 filed on May 19, 2020; which claims priority to German Patent Application Serial No. 10 2019 117 350.7 filed on Jun. 27, 2019; all of which are incorporated herein by reference in their entirety and for all purposes.

TECHNICAL FIELD

The present disclosure relates to an electronic device having a CRC generator, a method for transmitting data from an electronic device to a control unit, an optical sensor, and a method for transmitting data from an optical device to a control unit.

BACKGROUND

Optical sensors, such as ambient light sensors used in safety-relevant automotive applications, are designed to ensure that data transmission is protected against errors, i.e., so-called data integrity. The ISO standard for safety-related systems prescribes the use of CRC checking methods for monitoring the data transmission.

A CRC (cyclic redundancy check) procedure is a method for determining a check value or checksum for data in order to detect errors in the transmission of the data. The checksum is calculated for the data to be transmitted in an electronic device using a CRC generator. To calculate the checksum, the CRC generator is applied to the data to be transmitted. The checksum is then sent together with the data to a recipient, such as a control unit, where it is used to validate the data. Only the data sent from the electronic device to the control unit can be protected.

Before the data is read from the electronic device, the control unit sends the device address and the register address to the electronic device. However, the validity of the data is not guaranteed during the transmission of the device and the register addresses from the control unit to the electronic device. This can result in error modes if an incorrect device or an incorrect register is read out.

An objective is, inter alia, to create an optical sensor by means of which errors are minimized when reading out data to a control unit. A method for transmitting data from an optical sensor to a control unit will also be specified. In addition, an optical sensor will be created with which data can be transmitted to a control unit with a high level of data validity.

Finally, a method for transmitting data from an optical sensor to a control unit will be specified.

SUMMARY

An electronic device according to a first aspect of the present application comprises a communication interface, a storage unit, and a CRC generator.

The communication interface is designed to receive data from a control unit and to transmit or send data from the electronic device to the control unit. For example, the interface between the electronic device and the control unit can be an $I^2C$ (inter-integrated circuit) interface.

The storage unit has one or more registers that are used to store data. Each of the registers is assigned a specific register address.

The CRC generator is designed to generate a CRC checksum for data that is to be transmitted from the electronic device to the control unit.

If data stored in the storage unit is to be transmitted to the control unit, the control unit sends a device address specific to the electronic device and an address of a register in which the data to be transmitted is stored to the electronic device before the stored data is read out. This includes sending multiple register addresses to the electronic device if the data of more than one register is to be read out. The device address and the register address are received by the communication interface.

Before the CRC checksum is generated, the CRC generator is initialized with the device address received from the communication interface and/or the register address received from the communication interface. Other data received from the communication interface can also be used to initialize the CRC generator. After the CRC generator has been initialized, the CRC generator generates a CRC checksum for the data to be transmitted. The communication interface sends the data to be transmitted together with the CRC checksum to the control unit. The control unit can use the CRC checksum to perform a validation check of the received data.

It may be provided that the electronic device comprises a controller that is designed to initialize the CRC generator using the device address received from the communication interface and/or the register address received from the communication interface.

The electronic device allows both the data itself and the origin of the data to be validated during the reading process. Initializing the CRC generator with the device address and/or register address ensures that the data to be transmitted to the control unit originates from the same electronic device or the same register that was selected by the control unit. As a result, not only the data, but also the origin of the data is protected. Error modes in which data is read from the wrong electronic device or the wrong register due to a transmission error can be eliminated.

The electronic device is suitable for use in safety-relevant applications, in particular in automotive applications.

The communication interface can receive a read flag from the control unit before the data is read out to the control unit. By transmitting the read flag, the control unit indicates to the electronic device that data is to be transmitted from the storage unit to the control unit. According to one embodiment, the device address received from the communication interface is used together with the read flag received from the communication interface to initialize the CRC generator. For example, it is possible to use only the device address and the read flag, or both the device address with the read flag and the register address, in order to initialize the CRC generator.

After initialization, the CRC generator generates the CRC checksum, which is then sent to the control unit together with the data. To generate the CRC checksum, the data to be transmitted and at least one of the device address received from the communication interface and the register address received from the communication interface can be used. In other words, to generate the CRC checksum the CRC generator is applied to the data to be transmitted and also to the received device address and/or the received register address.

Alternatively, to generate the CRC checksum, the CRC generator can use the data to be transmitted and also the device address received from the communication interface with the read flag, and/or the register address received from the communication interface. In other words, in this embodiment the CRC generator is applied to the data to be transmitted and also to the received device address as well as to the received read flag and/or additionally to the received register address.

The two embodiments described above for generating the CRC checksum are particularly suitable for the case that only a single transmission of data to the control unit is desired after initialization of the CRC generator.

If multiple data transmissions from the electronic device to the control unit are intended, a phased method may be provided for generating the CRC checksum.

For example, to generate the CRC checksum for a first block of data to be transmitted to the control unit, the CRC generator can use the data to be transmitted and at least one of the device address received from the communication interface and the register address received from the communication interface. The first data block in this case is the data block that is transmitted immediately after the CRC generator has been initialized. For subsequent data blocks, only the data to be transmitted is used to generate the CRC checksum. The data blocks can also be designated as data packets. A certain pause is maintained between the transmission of consecutive data blocks, during which no data is transmitted from the storage unit.

Alternatively, to generate the CRC checksum for the first data block to be transmitted to the control unit, the CRC generator can use the data to be transmitted and at least one of the device address received from the communication interface with the read flag and the register address received from the communication interface. To generate the CRC checksum for subsequent data blocks to be transmitted to the control unit, only the data to be transmitted can be used in each case.

The CRC generator can generate the CRC checksum by means of a linear feedback shift register. A linear feedback shift register (LFSR) is a shift register with feedback that can be used to generate strictly deterministic pseudo-random number sequences. In digital technology, an LFSR is implemented as a shift register with n memory elements. The individual memory elements can be in particular D-flip-flops, which can each store one bit.

To initialize the CRC generator, the data used for initialization, i.e. the received device address, the received register address and/or the received read flag, is written to the memory elements of the LFSR.

For example, the LFSR can have 8 memory elements with one bit each. The device address can consist of 7 bits and the read flag of 1 bit. The register address consists of 8 bits. Then, for example, the device address and additionally the read flag, or the register address alone can be used to initialize the CRC generator by writing them into the 8 memory elements of the LFSR. After the LFSR has been initialized, the CRC generator can generate the CRC checksum for the data to be transmitted.

The electronic device may comprise a sensor element, in particular an optical sensor element. For example, the optical sensor element can have a photodiode and be designed to detect optical signals. In particular, this can be a digital ambient light sensor, which performs the function of measuring the ambient light and, in particular, its brightness. The sensor elements described may be designed for use in motor vehicles.

Furthermore, the control unit can be a master and the electronic device a slave.

According to a second aspect of the present application, a method for transmitting data from an electronic device to a control unit comprises storing data in a storage unit of the electronic device, the storage unit having one or more registers. If data stored in the storage unit is to be transmitted to the control unit, the control unit sends a device address specific to the electronic device and an address of a register in which the data to be transmitted is stored, and in particular a read flag, to the electronic device. A CRC generator is initialized by means of the device address received from the electronic device and/or the register address received from the electronic device and/or the read flag received from the electronic device. The CRC generator then generates a CRC checksum for the data to be transmitted. The data is transmitted from the electronic device to the control unit together with the CRC checksum. The CRC checksum allows the control unit to perform a validation check of the received data.

The method for transmitting data from an electronic device to a control unit according to the second aspect may have the embodiments described above of the electronic device according to the first aspect.

An optical sensor according to a third aspect of the application comprises a communication interface for transmitting data to a control unit and a CRC generator for generating a CRC checksum. The CRC generator is designed such that it generates a CRC checksum for the data to be transmitted to the control unit. The data is transmitted from the communication interface to the control unit together with the CRC checksum.

The optical sensor can be a digital ambient light sensor and designed in particular for a motor vehicle application.

A method for transmitting data from an optical sensor to a control unit provides, according to a fourth aspect of the present application, that a CRC generator generates a CRC checksum for the data to be transmitted to the control unit and the data is transmitted from the optical sensor to the control unit together with the CRC checksum.

The optical sensor according to the third aspect and the method for transmitting data from an optical sensor to a control unit according to the fourth aspect can have the embodiments described above of the electronic device according to the first aspect.

BRIEF DESCRIPTION OF THE DRAWINGS

In the following, exemplary embodiments are described in more detail by reference to the attached drawings. In the drawings, schematically in each case.

Figure 1:
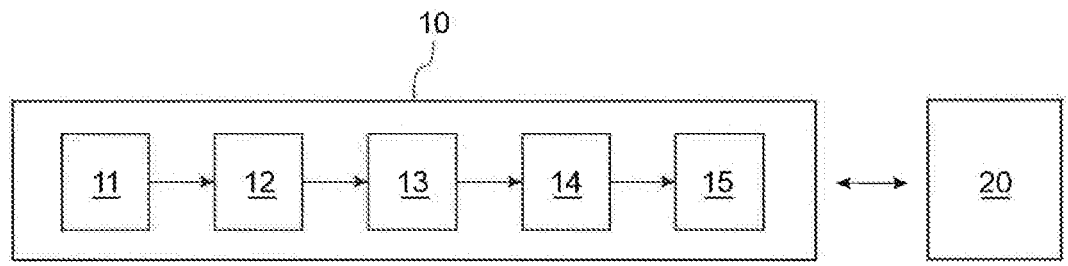
FIG. 1 shows an illustration of an electronic device and a control unit.

In the detailed description that follows, reference will be made to the attached drawings, which form part of this description and in which specific exemplary embodiments may be realized are shown for illustration purposes. Because components of exemplary embodiments can be positioned in a number of different orientations, the directional terminology is used for illustration purposes only, and is in no way restrictive. It goes without saying that other exemplary embodiments can be used and structural or logical changes can be made without departing from the scope of protection. It goes without saying that the features of the various exemplary embodiments described herein can be combined with one another, unless specifically stated otherwise. The following detailed description is therefore not to be interpreted in a restrictive sense. In the figures, identical or similar elements are labeled with identical reference numerals, where this is appropriate.

DETAILED DESCRIPTION

FIG. 1 shows a block diagram of an electronic device 10, which is designed as a digital ambient light sensor for an automotive application.

An ambient light sensor measures physical parameters of the environment, such as light intensity, and converts the readings into an electrical signal that can be in analog or digital form. For recording the measured values, the electronic device 10 contains a sensor element 11, a signal processing circuit 12, an analog-to-digital converter 13, a storage unit 14, and a communication interface 15.

The sensor element 11 can contain one or more photodiodes for recording optical signals. For example, the signal processing circuit 12 can contain a current-to-current amplifier or a current-to-voltage amplifier. The storage unit 14 contains multiple registers with associated register addresses in which the readings recorded by the sensor element 11 are stored after being processed by the signal processing circuit 12, and converted into digital data by the analog-to-digital converter 13.

An external control unit 20 can send data to the electronic device 10. The data transferred by the external control unit 20 comprises commands to the electronic device 10. The communication interface 15 receives the data sent by the control unit 20. In addition, the communication interface 15 can transmit data, for example readings recorded by the electronic device 10, to the control unit 20.

The interface between the electronic device 10 and the control unit 20 can be an I²C interface.

Figure 2:
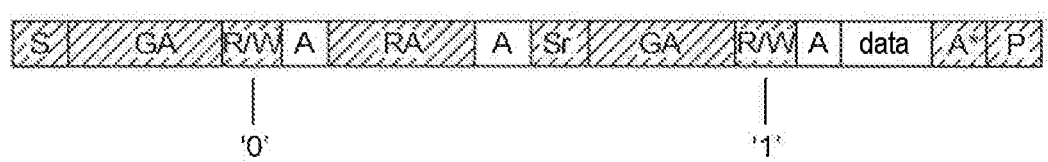
FIG. 2 shows a representation of an only partially secured read access of the control unit to the electronic device.

An example read access from the control unit 20 to the electronic device 10 by means of an I²C communication protocol is shown in FIG. 2. In this case the control unit 20 is the master and the electronic unit 10 is a slave. In FIG. 2 and all other figures the data transmission from the control unit 20 to the electronic device 10 is shown on a background of dashed lines and the data transmission from the electronic device 10 to the control unit 20 is shown on a white background.

In order to start communication with a slave, the control unit 20 first generates a start condition S on the I²C bus. The control unit 20 then sends a device address or slave address GA, which is specific to the electronic device 10 with which communication is to be performed, and a write flag to the electronic device 10. The write flag is one bit R/W, which has the value 0 for write access. The write flag indicates to the electronic device 10 that further data will be transmitted by the control unit 20.

After a confirmation signal A (known as an acknowledge signal) from the electronic device 10, which indicates that the data transmitted by the control unit 20 has been successfully received, the control unit 20 sends a register address RA of the register of the storage unit 14, the memory contents of which are to be read, to the electronic device 10.

To ensure that the communication is not interrupted by another device, the control unit 20 then sends a repeated start command Sr, which keeps the I²C bus occupied. The control unit 20 then transfers the device address GA specific to the electronic device 10 and a read flag. The read flag is one bit R/W, which has the value 1 for read access. The read flag indicates to the electronic device 10 that it should transmit the data stored in the said register to the control unit 20.

After a confirmation signal A, the communication interface 15 of the electronic device 10 sends the desired data to the control unit 20.

If the control unit 20 does not want to receive any further data, the control unit 20 acknowledges the data with a not acknowledge signal A*. To abort the communication, the control unit 20 generates a stop condition P.

Sensors used in safety-related automotive applications should be compatible with real-time diagnostic procedures that are designed to ensure the functional safety of electronic components (see International Standard ISO 26262-5:2011 (E): "Road vehicles—Functional Safety—Part 5: Product Development at the Hardware level", first edition, International Organization for Standardization, Geneva, Switzerland, Nov. 15, 2011).

A typical source of error is a fault during data transmission from the electronic device 10 to the control unit 20. If data bits become corrupted during transmission, the data can be misinterpreted by the control unit 20. This can lead to dangerous situations.

The international standard ISO 26262-5 recommends a cyclic redundancy check as a way to detect errors that can occur during data transmission between components in a vehicle.

Figure 3:
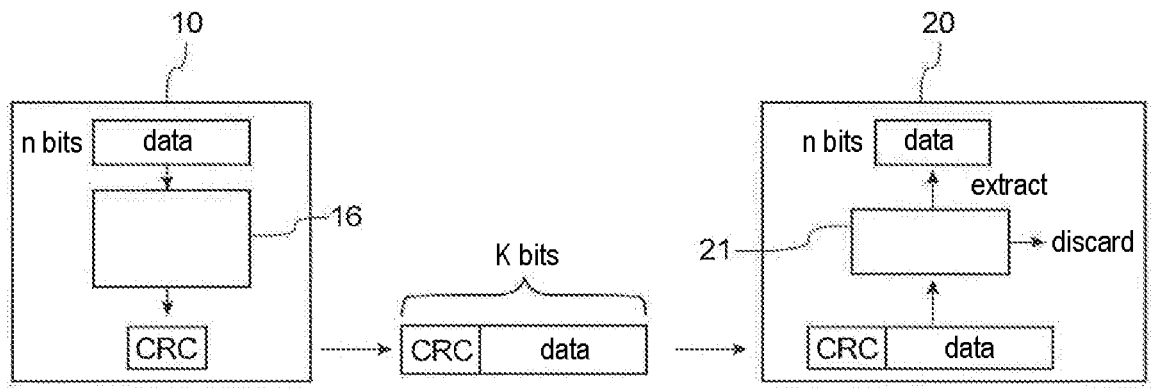
FIG. 3 shows an illustration of a cyclic redundancy check in the electronic device and the control unit.

The principle of the cyclic redundancy check is shown schematically in FIG. 3. The electronic device 10 contains a CRC generator 16, which uses a CRC polynomial to generate a CRC checksum on an n-bit data word to be sent from the electronic device to the control unit 20.

The CRC checksum is added to the data, which generates an encrypted message with k bits (with k>n). The encrypted message is transmitted to the control unit 20 via an insecure transmission channel. The control unit 20 uses a CRC generator 21, which corresponds to the CRC generator 16 of the electronic device 10, to check whether an error has occurred during the data transmission. If no error is detected, the original data is extracted from the encrypted message using a polynomial. If an error occurs, the data is discarded.

Figure 4:
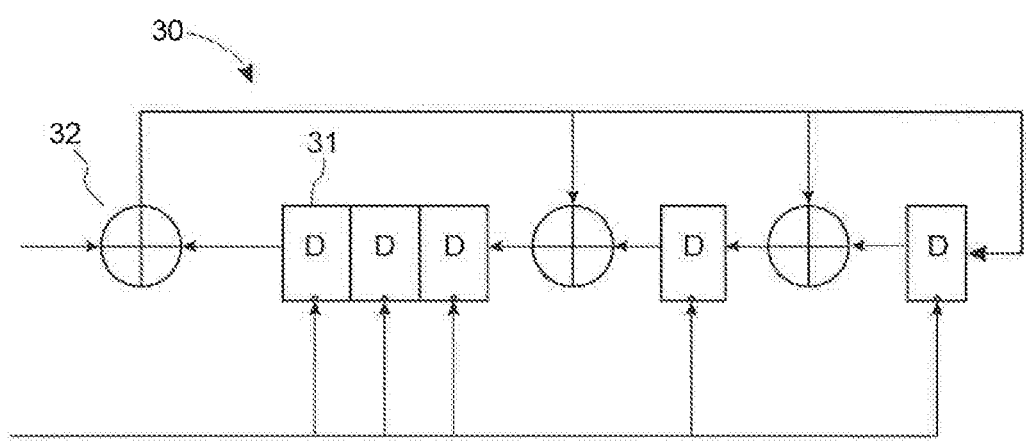
FIG. 4 shows an illustration of a linear feedback shift register.

To generate an encrypted message from the original data, an LFSR (linear feedback shift register) can be implemented in hardware. An exemplary LFSR 30 is shown in FIG. 4. The LFSR 30 contains a plurality of D-flip-flops 31, each of which can store one bit, and a plurality of XOR gates 32.

The original data word is sent through the LFSR 30 to generate the encrypted message. When all the data bits of the original data word have passed through the LFSR 30, the bits located in the D-flip-flops 31 correspond to the CRC checksum. The encrypted message is generated by appending the bits of the CRC checksum to the bits of the original data word.

Before calculating the CRC checksum, the LFSR 30 should be initialized by writing predefined values into the D-flip-flops 31. This can prevent the D-flip-flops 30 from being in an undefined state during system startup.

In the CRC procedure described above, data integrity can only be guaranteed in the case of read access in which data is transmitted from the electronic device 10 to the control unit 20. However, in the case of a write access in which data is transmitted from the control unit 20 to the electronic device 10, data integrity can only be ensured if the data is then transmitted back to the control unit 20 and checked there.

During a read access, the device address of the electronic device and the register address of the register to be read are transmitted from the control unit 20 to the electronic device 20 via an insecure transmission channel. If the bits of the register address are modified during transmission, it is possible that data could be read from the wrong registers. If the data transmission of the data read out to the control unit 20 proceeds correctly, no error would be detected even though the data originate from the wrong register. A similar error can occur if the bits of the device address are changed during transmission from the control unit 20 to the electronic device 10. In this case, data from another device would be read via the I²C bus without the error being noticed.

To ensure that the data is not only transmitted correctly from the electronic device 10 to the control unit 20 but also that the origin of the data can be verified, the LFSR 30 of the CRC generator 16 in the electronic device 10 is initialized before the data encryption is begun.

Figure 5:
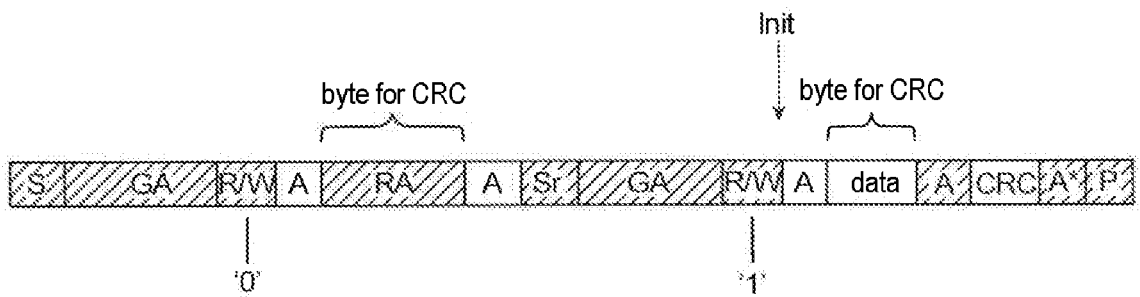
FIG. 5 shows an illustration of a read access from the control unit to the electronic device with an initialization of the CRC generator.

An exemplary embodiment of a read access to the storage unit 14 of the electronic device 10 with an initialization of the CRC generator 16 is shown in FIG. 5. With this read access, a one-off transmission of data to the control unit 20 is provided. In contrast to the read access shown in FIG. 2, in the read access according to FIG. 5 the LFSR 30 of the CRC generator 16 in the electronic device 10 is initialized. This initialization is indicated in FIG. 5 by an arrow labeled Init.

In FIG. 5, the LFSR 30 is initialized with the register address RA. The bits of the register address RA are written to the D-flip-flops 31 of the LFSR 30. Since the register address RA was previously transmitted from the control unit 20 to the electronic device 10, a possibly erroneous transmission of this data to the electronic device 10 could be detected later by the control unit 20.

The CRC checksum is then computed using the initialized CRC generator 16. To do so, as shown in FIG. 5 the polynomial of the CRC generator 16 is applied to both the register address RA and to the data to be transmitted. The calculated CRC checksum is transmitted to the control unit 20 after the data.

In a variant of FIG. 5, the initialization of the LFSR 30 is carried out by writing the device address GA and the read flag into the D-flip-flops 31. For the subsequent calculation of the CRC checksum, the polynomial of the CRC generator 16 is applied to the device address GA, the read flag, and the data to be transmitted.

Figure 6:
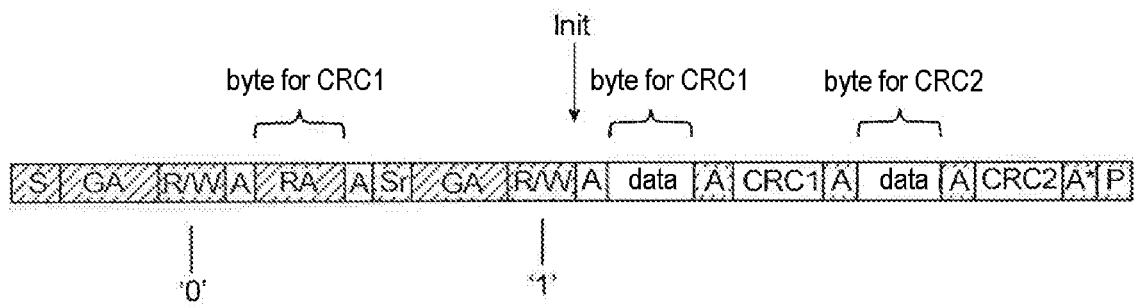
FIG. 6 shows an illustration of a read access from the control unit to the electronic device with an initialization of the CRC generator and a multiple data transmission.

A further exemplary embodiment of a read access to the storage unit 14 of the electronic device 10 is shown in FIG. 6. In contrast to FIG. 5, this read access provides for multiple data transmission from the electronic device 10 to the control unit 20. The initialization of the LFSR 30 is carried out as in FIG. 5 with the register address RA.

For the respective data transmission in the read access shown in FIG. 6, the CRC checksum is generated in a phased procedure.

For the first data transmission following the initialization of the LFSR 30, the CRC checksum CRC1 is calculated by applying the CRC generator 16 to the register address RA and the data to be transmitted. For the calculation of all subsequent CRC checksums, i.e. at least the CRC checksum CRC2, the CRC generator 16 is only applied to the data to be transmitted in each case.

In a variant of FIG. 6, the initialization of the LFSR 30 is carried out by writing the device address GA and the read flag into the D-flip-flops 31. For the subsequent calculation of the first CRC checksum CRC1, the polynomial of the CRC generator 16 is applied to the device address GA, the read flag, and the data to be transmitted. The subsequent CRC checksums are calculated using only the data to be transmitted.

Figure 7:
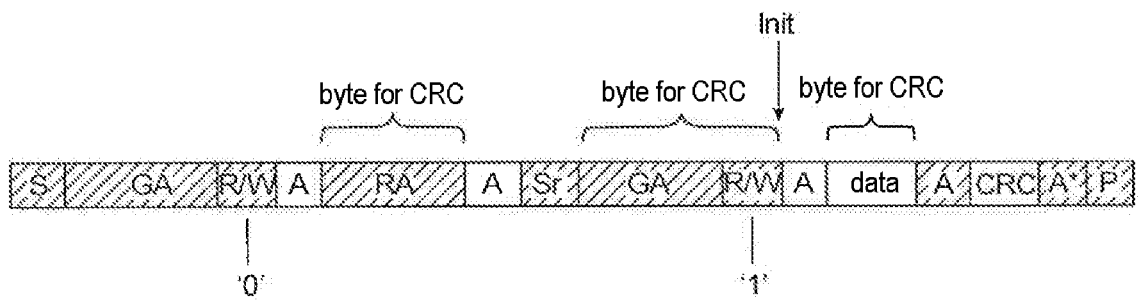
FIG. 7 shows an illustration of a variant of the read access shown in FIG. 5.

FIG. 7 shows another variant of the read access shown in FIG. 5. The LFSR 30 for the read access according to FIG. 7 is initialized using the device address GA, the read flag, and the register address RA. To generate the CRC checksum, the CRC generator CRC is applied to the register address RA, the device address GA, the read flag, and the data to be transmitted.

Figure 8:
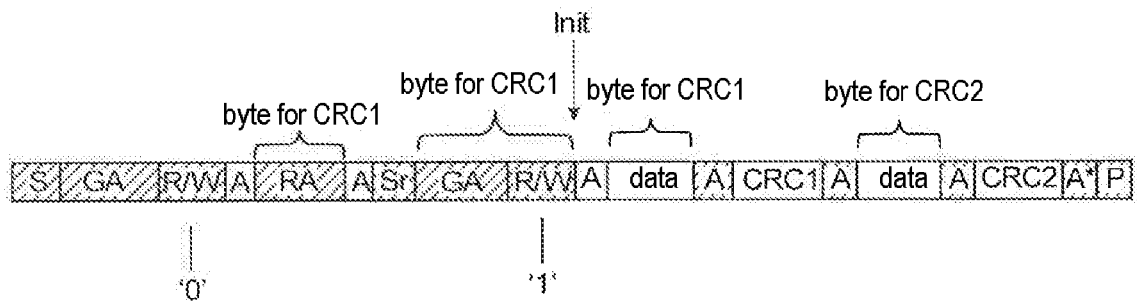
FIG. 8 shows an illustration of a variant of the read access shown in FIG. 6.

FIG. 8 shows another variant of the read access shown in FIG. 6. The LFSR 30 for the read access according to FIG. 8 is initialized using the device address GA, the read flag, and the register address RA. To generate the first CRC checksum CRC1 after initialization, in FIG. 8 the CRC generator CRC is applied to the register address RA, the device address GA, the read flag, and the data to be transmitted. For the calculation of subsequent CRC checksums, the CRC generator 16 is only applied to the data to be transmitted in each case.

LIST OF REFERENCE SIGNS

10 electronic device
11 sensor element
12 signal processing circuit
13 analog-to-digital converter
14 storage unit
15 communication interface
16 CRC generator
20 control unit
21 CRC generator
30 LFSR
31 D-flip-flop
32 XOR gate

The invention claimed is:

1. An optical sensor comprising:
 a communication interface configured to receive data from a control unit and configured to transmit data to the control unit;
 a storage unit with at least one register for storing data; and
 a CRC generator configured to generate a CRC checksum;
 wherein the optical sensor is configured in such a way that when data stored in the storage unit is to be transmitted to the control unit, the communication interface is configured to receive from the control unit a device address specific to the optical sensor and an address of a register in which the data to be transmitted is stored; and
 the CRC generator is initialized based on the device address received from the communication interface and/or the register address received from the communication interface, before the CRC generator generates a CRC checksum for the data to be transmitted.

2. The optical sensor as claimed in claim 1, wherein the optical sensor is configured in such a way that when data stored in the storage unit is to be transmitted to the control unit, the communication interface receives a read flag from the control unit, and the CRC generator is initialized based on the device address received from the communication interface and the read flag received from the communication interface.

3. The optical sensor as claimed in claim 1, wherein the CRC generator is configured to generate the CRC checksum based on the data to be transmitted and at least one of the device address received from the communication interface and the register address received from the communication interface.

4. The optical sensor as claimed in claim 2, wherein the CRC generator is configured to generate the CRC checksum based on the data to be transmitted and additionally the device address received from the communication interface together with the read flag received from the communication interface and/or the register address received from the communication interface.

5. The optical sensor as claimed in claim 2, wherein the CRC generator is configured to generate the CRC checksum for a first data block to be transmitted to the control unit based on the data to be transmitted and, in addition, the device address received from the communication interface together with the read flag received from the communication interface and/or the register address received from the communication interface, and wherein the CRC generator is configured to generate the CRC checksum for subsequent data blocks to be transmitted to the control unit based on only the data to be transmitted in each case.

6. The optical sensor as claimed in claim 1, wherein the CRC generator is configured to generate the CRC checksum for a first data block to be transmitted to the control unit based on the data to be transmitted and at least one of the device address received from the communication interface and the register address received from the communication interface, and wherein the CRC generator is configured to generate the CRC checksum for subsequent data blocks to be transmitted to the control unit based on only the data to be transmitted in each case.

7. The optical sensor as claimed in claim 1, wherein the CRC generator has a linear feedback shift register with a plurality of memory elements; and wherein the data used for the initialization are written to the memory elements to initialize the CRC generator.

8. The optical sensor as claimed in claim 1, wherein the optical sensor is an ambient light sensor.

9. A method for transmitting data from an optical sensor to a control unit, wherein the method comprises:
    storing data in a memory unit of the optical sensor with at least one register when data stored in the memory unit is to be transmitted to the control unit;
    sending, by the control unit, a device address specific to the optical sensor and an address of a register in which the data to be transmitted is stored to the optical sensor; and
    initializing a CRC generator, based on the device address received from the optical sensor and/or the register address received from the optical sensor, before the CRC generator generates a CRC checksum for the data to be transmitted and the data is transmitted together with the CRC checksum from the optical sensor to the control unit.

10. The method as claimed in claim 9, wherein the optical sensor is configured in such a way that when data stored in the memory unit is to be transmitted to the control unit, and wherein the method further comprises sending, by the control unit, a read flag to the optical sensor and initializing the CRC generator based on the device address received from the communication interface and the read flag received from the communication interface.

11. The method as claimed in claim 9, wherein the optical sensor is an ambient light sensor.

* * * * *